United States Patent [19]

Grueter

[11] 4,382,193

[45] May 3, 1983

[54] CHARGE TRANSFER MEMORY IN SERIAL-PARALLEL-SERIAL ORGANIZATION

[75] Inventor: Otto Grueter, Krailling, Fed. Rep. of Germany

[73] Assignee: Siemens Aktiengesellschaft, Berlin & Munich, Fed. Rep. of Germany

[21] Appl. No.: 242,973

[22] Filed: Mar. 12, 1981

Related U.S. Application Data

[63] Continuation of Ser. No. 61,270, Jul. 27, 1979, abandoned.

[30] Foreign Application Priority Data

Sep. 28, 1978 [DE] Fed. Rep. of Germany ....... 2842285

[51] Int. Cl.$^3$ ...................... G11C 19/28; H01L 29/78; G11C 11/34
[52] U.S. Cl. ................................. 307/221 D; 357/24; 365/183
[58] Field of Search ...................... 357/24; 307/221 D; 365/183

[56] References Cited

U.S. PATENT DOCUMENTS

| | | | |
|---|---|---|---|
| 3,897,282 | 7/1975 | White | 357/24 R |
| 3,913,077 | 10/1975 | Erb | 357/24 R |
| 3,967,254 | 6/1976 | Kosonocky et al. | 357/24 R |
| 4,035,906 | 7/1977 | Tasch et al. | 357/24 R |
| 4,103,347 | 7/1978 | Barton | 357/24 R |
| 4,211,936 | 7/1980 | Kosonocky et al. | 357/24 R |
| 4,236,830 | 12/1980 | Schlig | 357/24 R |

FOREIGN PATENT DOCUMENTS 2518017 11/1976 Fed. Rep. of Germany.

Primary Examiner—Gene M. Munson
Attorney, Agent, or Firm—Hill, Van Santen, Steadman, Chiara & Simpson

[57] ABSTRACT

A serial-parallel-serial organized charge transfer memory is integrated on a semiconductor chip and includes a read-in chain consisting of first and second charge transfer elements alternately arranged behind one another, respectively controllable by way of clock pulse lines, and comprising memory and shift electrodes, and a field of parallel chains of charge transfer elements into which charges characterizing information are transferred either only from the first or only from the second charge transfer elements of the read-in chain, and a read-out chain constructed as the read-in chain and operated by way of clock pulse lines. The like electrodes of the charge transfer elements of the read-in and read-out chains, together with the appertaining control and clock pulse lines respectively consist of a continuous conduction band, at least in the area of the serial read-in and read-out chains of the chip.

1 Claim, 6 Drawing Figures

CHARGE TRANSFER MEMORY IN SERIAL-PARALLEL-SERIAL ORGANIZATION

This is a continuation of application Ser. No. 061,270, filed July 27, 1979, now abandoned.

BACKGROUND OF THE INVENTION

1. Field of the Invention

The present invention relates to a charge transfer memory integrated on a semiconductor chip and having a read-in chain of first and second charge transfer elements alternately arranged behind one another and controllable by way of clock pulse lines, with memory and transfer electrodes, and a field of parallel chains of charge transfer elements into which charges characterizing information can be taken over either only from the first or only from the second charge transfer elements of the read-in chain, and having a read-out chain constructed in the same manner as the read-in chain.

2. Description of the Prior Art

Charge transfer memories constructed in a so-called compressed serial-parallel-serial technique, are described, for example, in the German published application No. 2,551,797 or, respectively, the German published application No. 2,518,017, and comprise a serially arranged read-in chain of charge transfer elements, a parallel chain of charge transfer elements allocated to each memory electrode of the serial chain, and of a further serially arranged read-out chain.

By means of such an organization, a very high bit density can be achieved.

As can be seen from the above-mentioned German published applications, the clock pulse program for controlling the memory organizing such a manner is relatively complicated. Inasmuch as information is contained only under each second memory electrode, the serial chain must be read-in twice and the information must be transferred into the parallel field twice. Upon transfer, the information resides under the odd-numbered memory electrodes the first time and under the even-numbered memory electrodes the second time. Therefore, the second transfer must occur displaced by a shift clock pulse. This means that the transfer clock pulses do not arrive at equal intervals, but rather are somewhat displaced with respect to one another. The generation of such non-periodic transfer clock pulses, however, is quite expensive in toto.

In order to create a charge transfer memory in the compressed serial-parallel-serial organization having high bit density which can be controlled in a simple and cost-effective manner with a strictly periodic clock pulse program, it has been proposed to allocate a group of at least two neighboring parallel chains of charge transfer elements provided with receiving or, respectively, delivery electrodes to each first or second charge transfer element of the read-in and read-out chains.

By means of such a memory organization, the charge defining the information is always transferred from the same memory electrodes of the read-in chain and is alternately input into two neighboring parallel chains or, respectively, is always delivered into the same memory electrode of the read-out chain from two neighboring parallel chains.

Charge transfer memories having the specified organizational form can, like all such charge transfer memories, be constructed as two-phase charge transfer memories or as four-phase charge transfer memories. It is likewise possible to actuate four-phase charge transfer memories in two-phase operation. The considerations undertaken in the following hold true for a four-phase charge transfer memory which, for example, is actuated in two-phase operation, a manner of operating in which each second electrode (memory electrode) is driven at the same time as the neighboring electrode (shift electrode). Thereby, an element is defined as a charge transfer element which is composed of memory and shift electrodes.

In previously known charge transfer memories in serial-parallel-serial organization, and constructed in the double silicon technique, the four clock pulses of the serial chains were all supplied from the exterior of the memory field. Such a construction requires a great deal of space on the chip and per period of a serial chain, two contacts are required to a respective additional metal path, namely one of polysilicon-1 (memory electrode) and one of polysilicon-2 (shift electrode).

The charge transferring channel was constricted in the manner of a bottle neck at the cross over from the serial chain into the parallel field and vice versa in the compressed serial-parallel-serial memory modules.

Such constrictions can detrimentally increase the charge losses. Moreover, this location determines the grid dimension and, therefore, the packing density of the serial chains.

SUMMARY OF THE INVENTION

The object of the present invention is to provide a charge transfer memory in serial-parallel-serial organization with which the supply of the serial chains with driving clock pulses can be accomplished without special metallic clock pulse lines in a simple manner.

The above object is achieved, according to the present invention, in that, at least in the area of the serial read-in and read-out chains of the memory field, the electrodes of the same kind of the charge transfer elements of the read-in and read-out chain respectively consist of a continuous polysilicon conduction band in common with the appertaining clock pulse lines.

Thereby, the memory electrode of the charge transfer elements exhibits the form of two bands proceeding parallel, engaging into one another comb-like, and laterally limiting the areas of the read-in chain and the read-out chain of the memory field.

In a particular embodiment of the invention, the shift electrodes of the charge transfer elements of the read-in chain and the read-out chain likewise exhibit the form of two bands proceeding parallel and engaging in one another in a comb-like fashion, which are arranged parallel to the memory electrodes in the area of the comb teeth of the memory electrodes.

In a further advantageous embodiment of the invention, the shift electrodes have the form of two bands proceeding parallel to one another and arranged in the area of the teeth of the memory electrodes.

In the specified advantageous embodiment of a compressed serial-parallel-serial memory field, no special metallic clock pulse lines are required for the clock pulse supplies to the serial chain, since the shift and memory electrodes of the serial chains themselves serve as the clock pulse lines. Therewith, the metallic paths and all technologically sensitive contacts between silicon and metal no longer exists.

A further advantage is the small space requirement and, in the first embodiment of the invention, the lack of bottle neck constrictions of the charge carrying charge coupled device (CCD) channel.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
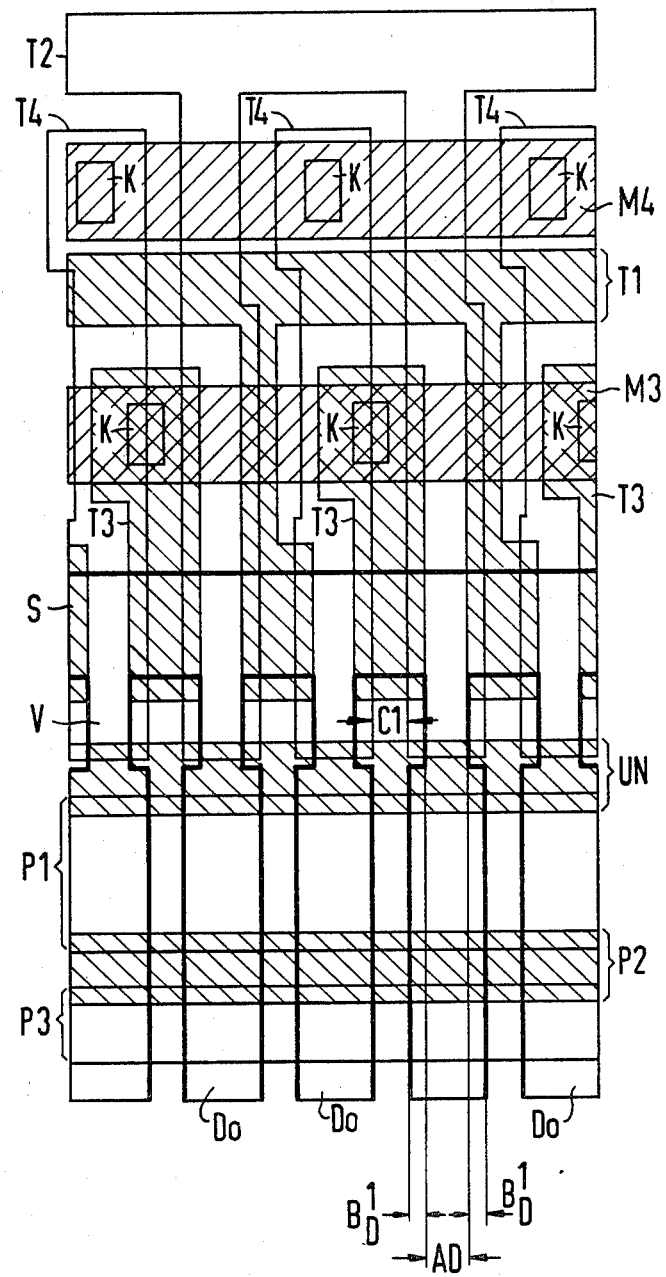
FIG. 1 is a schematic plan view of the design of a known charge transfer memory constructed in the compressed serial-parallel-serial organization.

In the charge transfer memory illustrated in FIG. 1, the memory is constructed in the so-called compressed serial-parallel-serial technique, as is described in the German published application No. 2,551,797 or in the German published application No. 2,518,017 and comprises a parallel chain consisting of charge transfer elements arranged below each memory electrode of a serial chain. The design illustrated in FIG. 1 is essentially limited to the serial chain and its four clock pulse lines T1–T4 and their assigned electrodes, and to the parallel chain having the transfer electrode UN and the first electrodes P1–P3 of the actual memory field. The serial read-out chain, which is likewise required, is constructed in an analogous manner.

The serial chain essentially consists of the memory electrodes T2 and T4 consisting of polysilicon-1 and of the shift electrodes T1 and T3 consisting of polysilicon-2 (illustrated with left-hand shading). Thereby, the memory electrode T2 extends to the upper edge of the memory field and serves at the same time as the clock pulse line. The shift electrode T1 consisting of polysilicon-2 is likewise designed continuously. The memory electrode T4 and the shift electrode T3 must be supplied with the required control clock pulses by way of special metal bands M4 and M3 (right-hand shading) and the assigned contact surfaces K. The parallel chains having the transfer electrode UN and the shift electrode (left-hand shading) consisting of polysilicon-2 and the memory electrodes P1 and P3 consisting of polysilicon-1 are connected to the serial chain. The individual parallel chains are separated from one another by means of layers consisting of thick oxide Do. As can be seen from FIG. 1, the CCD channel is constructed with a constriction at the cross over V from the serial chain S into the parallel field, and vice versa. This location V determines the grid dimension of the serial chain and, therefore, the packing density of the entire arrangement. There also occurs, as a grid dimension for the constriction, $2 \times (A^D + 2B_D{}^1 + C1)$, where AD designates the minimum structural dimension (distance between two thick oxide areas) and $B_D{}^1$ designates the overlapping of polysilicon-1 over the thick oxide areas which is necessary in order to exclude errors arising as a result of the unavoidable misalignment of the masks, while C1 designates the minimum distance between two polysilicon-1 paths.

In a serial-parallel-serial memory module in compressed organization constructed according to FIG. 1, information only resides under each second memory electrode upon reading into the memory module, so that the serial chain must be read-in twice and must be transferred twice into the parallel field. Upon the transfer, the information resides under the odd-numbered memory electrodes the first time and under the even-numbered memory electrodes the second time. Upon transfer, therefore, a shift clock pulse must occur in a displaced form. Such a memory construction makes the clock pulse program uneven, i.e. it can no longer be constructed strictly periodically.

Figure 2:
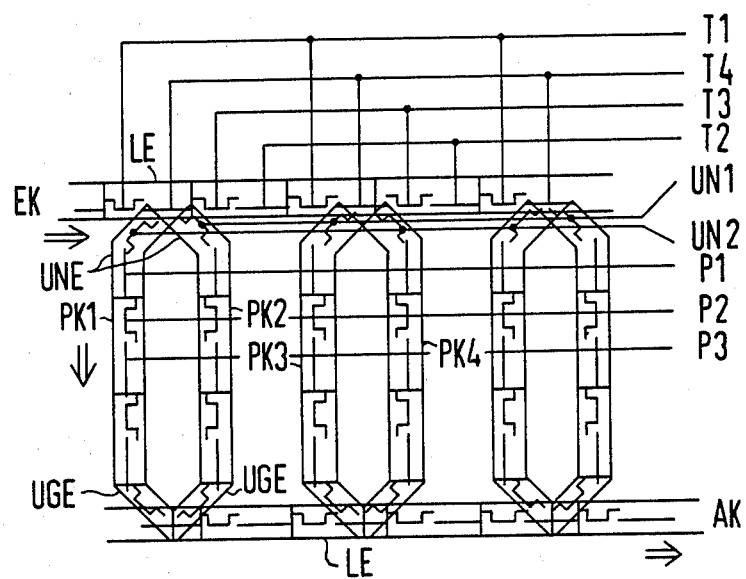
FIG. 2 is a diagrammatic view of a charge transfer memory in serial-parallel-serial organization having a strictly periodic clock pulse drive.

If, according to FIG. 2, one assigns at least one group of two neighboring parallel chains PK1 and PK2 of charge transfer elements provided with transfer, or respectively, delivery electrodes UNE, UGE to each first charge transfer element LE of the read-in chain EK and the read-out chain AK, then the appertaining clock pulse program for the transfer pulses UN1 and UN2 becomes strictly periodic. This means that the transfer clock pulse UN2 lies precisely in the middle between transfer clock pulses UN1.

Figure 3:
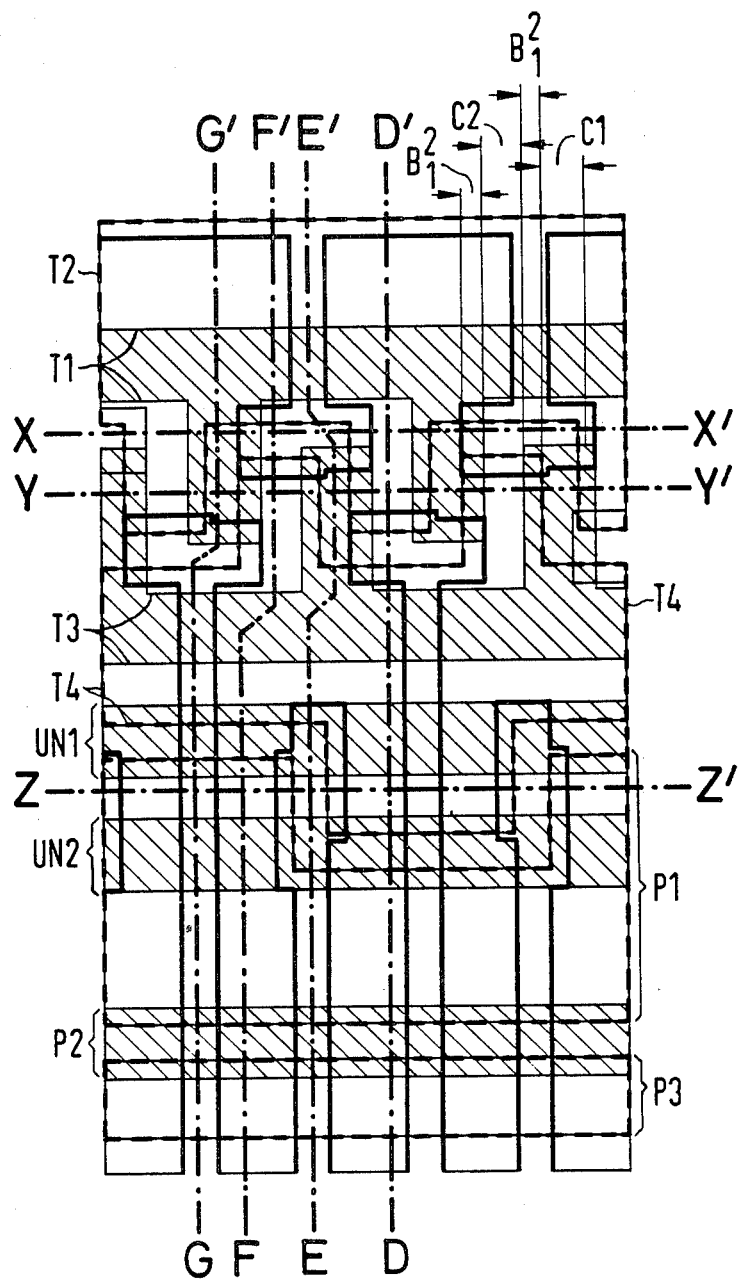
FIG. 3 is a schematic illustration of the layout of a charge transfer memory according to FIG. 2.

With such an organization, a design corresponding to that of FIG. 3 is possible, whereby, in contrast however, the information charges are fed in from the right in FIG. 2. Thereby, the like electrodes for charge transfer elements of the read-in chain and the read-out chain consist of a continuous conduction band (T1–T4) in common with the appertaining clock pulse lines, at least in the area of the serial read-in chain and the serial read-out chain of the memory field.

Thereby, the polysilicon-1 memory electrodes T2 and T4 of the charge transfer elements of the read-in chain and the read-out chain have the form of two bands extending parallel and engaging in one another in a comb-like fashion, as with interdigital lines, and laterally limiting the areas of the read-in chain and the read-out chain. The polysilicon-2 memory electrodes T1 and T3 also exhibit the form of two bands which extend parallel and engage in one another in a comb-like fashion. Thereby, in the area of the teeth of the memory electrodes T2 and T4, the same are arranged parallel to the memory electrodes. Therewith, the metal paths no longer exist within the clock pulse supply and, therefore, all technologically sensitive contacts are eliminated. There occurs therewith a significant gain in space. As can be seen from FIG. 3, there are no bottleneck like constrictions of the CCD channel; and the grid dimension, accordingly, is only determined by means of the serial chain itself. Namely, the grid dimension occurs at $R = 2 \times (C2 + 2B_1{}^2 + C1)$, wherein C2 designates the minimum distance between the two electrodes consisting of polysilicon-2 (the shift electrodes T1 and T3), C1 designates the minimum interval between two electrodes consisting of polysilicon-1 (the memory electrodes T2 and T4) and $B_1{}^2$ designates the necessary overlapping of polysilicon-2 over the polysilicon-1.

Figure 4:
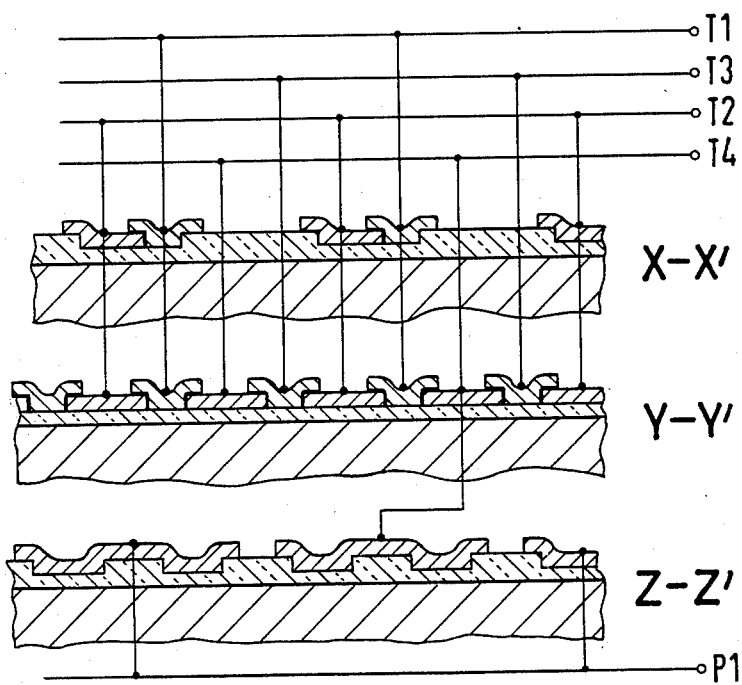
FIG. 4 is a sectional view of the charge transfer memory of FIG. 3 including three sections taken along the parting lines X—X', Y—Y' and Z—Z'.
Figure 5:
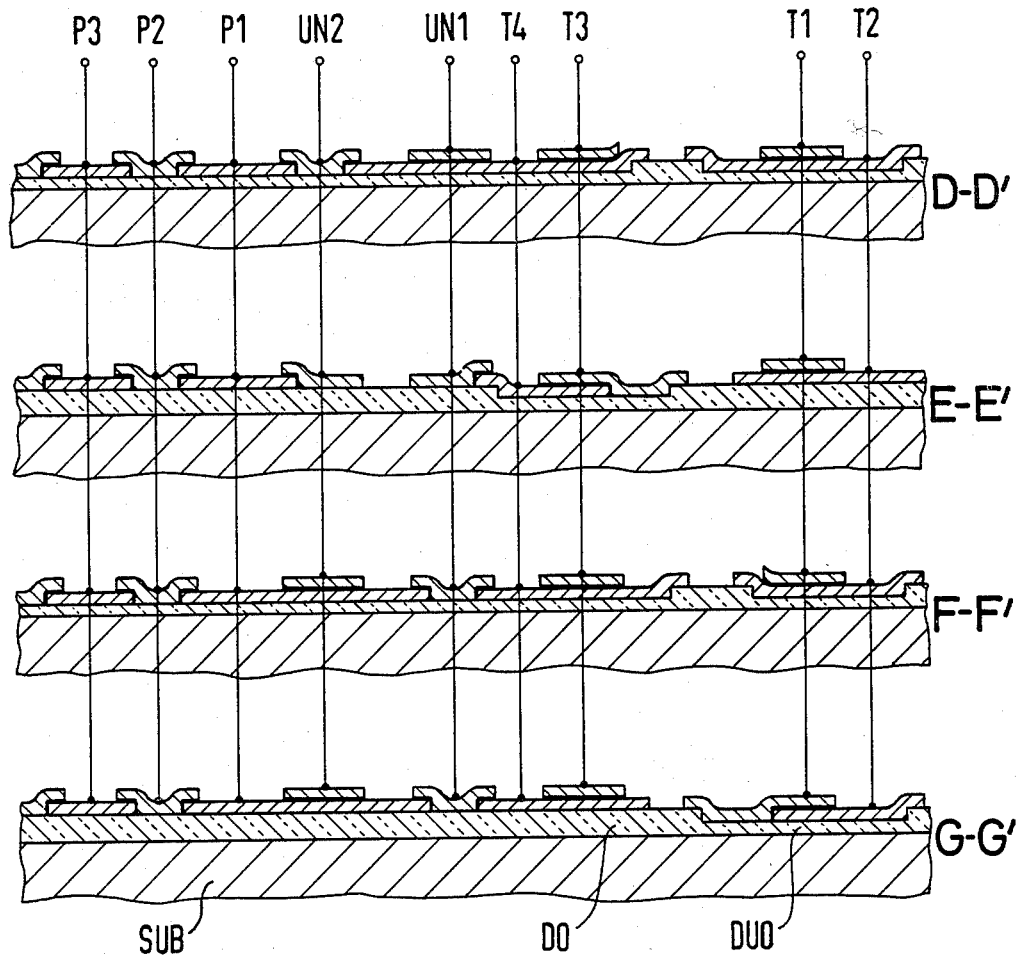
FIG. 5 is a sectional view of the charge transfer memory of FIG. 3, taken in four sections along the parting lines D—D', E—E', F—F' and G—G'.

The structural design of the circuit arrangement according to FIG. 3 occurs as seen in the sectional views of FIGS. 4 and 5 which have the section lines referenced in detail.

Figure 6:
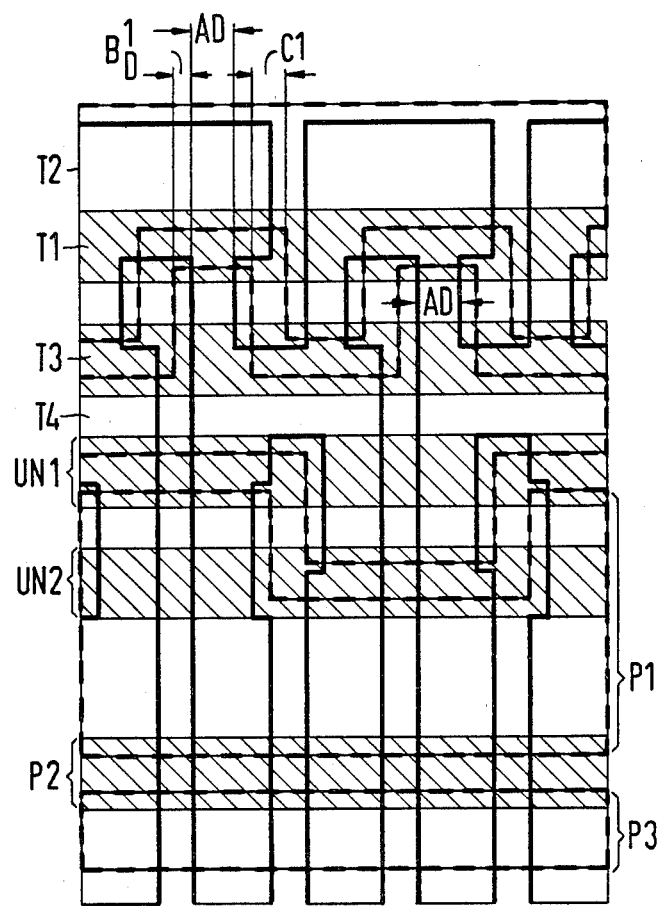
FIG. 6 is a schematic plan view of the design of a charge transfer memory having meander or serpentine-type elements.

A further reduction of the space requirement on the chip occurs by means of the design illustrated in FIG. 6, in which, however, minimal widths AD of the CCD channel again occur. Here, the shift electrodes T1 and T3 have the form of two bands extending parallel, arranged in the area of the teeth of the memory electrodes T2 and T4. By means of the serpentine course of the CCD channel of the serial chain resulting therefrom, the grid dimension is determined only by means of the minimum dimensions of the oxide etching, and of the polysilicon-1 plane (the memory electrodes T2 and T4). The polysilicon-2 plane, which is more critical with respect to the etching and alignment, no longer plays the role with reference to the minimum dimensions, so that there occurs for the grid dimension, the relationship $R = 2 \times (AD + 2B_D{}^1 + C1)$.

Although I have disclosed my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a series-parallel-series charge transfer memory integrated on a chip for four phase operation, in which series read-in and read-out chains each comprise charge transfer elements each having a memory electrode and a transfer electrode, in which corresponding electrodes of each second charge transfer element of the read-in chain and of the read-out chain has coupled thereto a group of at least two of the parallel chains, and in which the four clock pulse voltages for the read-in chain and the read-out chain are supplied via respective clock lines, the improvement wherein:

the electrodes associated with a respective clock pulse voltage comprise a continuous polysilicon strip conductor;

that the transfer electrodes comprise comb-shaped structures; and the four polysilicon conductors are arranged with respect to the transfer electrodes such that a tooth of the comb shaped structure assigned to a memory electrode is partially covered by two teeth belonging to different transfer electrodes on opposite sides thereof so that the required clock pulse voltages are fed to the electrodes directly by way of the polysilicon conductors.

* * * * *